US008029620B2

(12) United States Patent
Kim et al.

(10) Patent No.: US 8,029,620 B2
(45) Date of Patent: Oct. 4, 2011

(54) METHODS OF FORMING CARBON-CONTAINING SILICON EPITAXIAL LAYERS (75) Inventors: Yihwan Kim, Milpitas, CA (US); Zhiyuan Ye, Cupertino, CA (US); Ali Zojaji, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/831,055

(22) Filed: Jul. 31, 2007

(65) Prior Publication Data
US 2008/0022924 A1 Jan. 31, 2008

Related U.S. Application Data (60) Provisional application No. 60/834,773, filed on Jul. 31, 2006.

(51) Int. Cl.
C30B 25/12 (2006.01)
C30B 25/14 (2006.01)
(52) U.S. Cl. ............... 117/85; 117/88; 117/89; 117/90; 117/93; 117/95; 117/97
(58) Field of Classification Search .......... 117/93, 117/95, 97, 83–90, 101
See application file for complete search history.

(56) References Cited

U.S. PATENT DOCUMENTS

| 3,675,619 A | 7/1972 | Burd |
| 4,429,324 A | 1/1984 | Wilkens |
| 4,834,831 A | 5/1989 | Nishizawa et al. |
| 4,865,659 A * | 9/1989 | Shigeta et al. ............... 148/33.4 |
| 5,112,439 A | 5/1992 | Reisman et al. |
| 5,236,545 A * | 8/1993 | Pryor ............................... 117/95 |
| 5,273,930 A | 12/1993 | Steele et al. |
| 5,288,658 A | 2/1994 | Ishihara |
| 5,294,286 A | 3/1994 | Nishizawa et al. |
| 5,360,760 A | 11/1994 | Hayashi |
| 5,363,800 A * | 11/1994 | Larkin et al. ................... 438/507 |
| 5,372,860 A | 12/1994 | Fehlner et al. |
| 5,374,570 A | 12/1994 | Nasu et al. |

(Continued)

FOREIGN PATENT DOCUMENTS

EP 1 150 345 10/2001

(Continued)

OTHER PUBLICATIONS

Maruno et al., "Selective Epitaxial Growth by Ultrahigh-Vacuum Chemical Vapor Deposition with Alternating Gas Supply of $Si_2H_6$ and $CI_2$", Nov. 2000, Japanese Journal of Applied Physics, vol. 39, No. 11, Part 1, pp. 6139-6142.

(Continued)

*Primary Examiner* — Bob M Kunemund
*Assistant Examiner* — G. Nagesh Rao
(74) *Attorney, Agent, or Firm* — Dugan & Dugan, PC (57) ABSTRACT

In a first aspect, a method is provided for forming an epitaxial layer stack on a substrate. The method includes (1) selecting a target carbon concentration for the epitaxial layer stack; (2) forming a carbon-containing silicon layer on the substrate, the carbon-containing silicon layer having at least one of an initial carbon concentration, a thickness and a deposition time selected based on the selected target carbon concentration; and (3) forming a non-carbon-containing silicon layer on the carbon-containing silicon layer prior to etching. Numerous other aspects are provided.

15 Claims, 5 Drawing Sheets

U.S. PATENT DOCUMENTS

| | | | |
|---|---|---|---|
| 5,378,651 A | 1/1995 | Agnello et al. | |
| 5,469,806 A | 11/1995 | Mochizuki et al. | |
| 5,480,818 A | 1/1996 | Matsumoto et al. | |
| 5,503,875 A | 4/1996 | Imai et al. | |
| 5,521,126 A | 5/1996 | Okamura et al. | |
| 5,527,733 A | 6/1996 | Nishizawa et al. | |
| 5,674,304 A | 10/1997 | Fukada et al. | |
| 5,693,139 A | 12/1997 | Nishizawa et al. | |
| 5,796,116 A | 8/1998 | Nakata et al. | |
| 5,807,792 A | 9/1998 | Ilg et al. | |
| 5,849,092 A | 12/1998 | Xi et al. | |
| 5,906,680 A | 5/1999 | Meyerson | |
| 5,916,365 A | 6/1999 | Sherman | |
| 6,019,839 A | 2/2000 | Achutharaman et al. | |
| 6,022,587 A | 2/2000 | Acutharaman et al. | |
| 6,025,627 A | 2/2000 | Forbes et al. | |
| 6,042,654 A | 3/2000 | Comita et al. | |
| 6,055,927 A | 5/2000 | Shang et al. | |
| 6,064,081 A * | 5/2000 | Robinson et al. | 257/183 |
| 6,110,291 A | 8/2000 | Haruta et al. | |
| 6,124,158 A | 9/2000 | Dautartas et al. | |
| 6,144,060 A | 11/2000 | Park et al. | |
| 6,159,852 A | 12/2000 | Nuttall et al. | |
| 6,177,717 B1 | 1/2001 | Chantre et al. | |
| 6,200,893 B1 | 3/2001 | Sneh | |
| 6,207,487 B1 | 3/2001 | Kim et al. | |
| 6,228,728 B1 | 5/2001 | Furukawa et al. | |
| 6,232,196 B1 | 5/2001 | Raaijmakers et al. | |
| 6,270,572 B1 | 8/2001 | Kim et al. | |
| 6,284,646 B1 | 9/2001 | Leem | |
| 6,284,686 B1 | 9/2001 | Marlor | |
| 6,287,965 B1 | 9/2001 | Kang et al. | |
| 6,291,319 B1 | 9/2001 | Yu et al. | |
| 6,305,314 B1 | 10/2001 | Sneh et al. | |
| 6,335,280 B1 | 1/2002 | van der Jeugd | |
| 6,342,277 B1 | 1/2002 | Sherman | |
| 6,348,420 B1 | 2/2002 | Raaijmakers et al. | |
| 6,352,945 B1 | 3/2002 | Matsuki et al. | |
| 6,358,829 B2 | 3/2002 | Yoon et al. | |
| 6,383,955 B1 | 5/2002 | Matsuki et al. | |
| 6,391,785 B1 | 5/2002 | Satta et al. | |
| 6,391,803 B1 | 5/2002 | Kim et al. | |
| 6,399,491 B2 | 6/2002 | Jeon et al. | |
| 6,410,463 B1 | 6/2002 | Matsuki | |
| 6,451,119 B2 | 9/2002 | Sneh et al. | |
| 6,458,718 B1 | 10/2002 | Todd | |
| 6,462,367 B2 | 10/2002 | Marsh et al. | |
| 6,468,924 B2 | 10/2002 | Lee et al. | |
| 6,489,241 B1 | 12/2002 | Thilderkvist et al. | |
| 6,492,283 B2 | 12/2002 | Raaijmakers et al. | |
| 6,511,539 B1 | 1/2003 | Raaijmakers | |
| 6,534,395 B2 | 3/2003 | Werkhoven et al. | |
| 6,544,900 B2 | 4/2003 | Raaijmakers et al. | |
| 6,559,520 B2 | 5/2003 | Matsuki et al. | |
| 6,562,720 B2 | 5/2003 | Thilderkvist et al. | |
| 6,576,535 B2 * | 6/2003 | Drobny et al. | 438/507 |
| 6,590,344 B2 | 7/2003 | Tao et al. | |
| 6,620,670 B2 | 9/2003 | Song et al. | |
| 6,630,413 B2 | 10/2003 | Todd | |
| 6,632,279 B1 | 10/2003 | Ritala et al. | |
| 6,653,212 B1 | 11/2003 | Yamanaka et al. | |
| 6,656,812 B1 | 12/2003 | Marty et al. | |
| 6,750,119 B2 * | 6/2004 | Chu et al. | 438/479 |
| 6,776,841 B2 | 8/2004 | Pyi | |
| 6,797,558 B2 | 9/2004 | Nuttall et al. | |
| 6,821,825 B2 | 11/2004 | Todd | |
| 6,908,866 B2 * | 6/2005 | Chu et al. | 438/778 |
| 6,998,305 B2 | 2/2006 | Arena et al. | |
| 7,045,840 B2 | 5/2006 | Tamai | |
| 7,121,286 B2 | 10/2006 | Nakao | |
| 7,183,576 B2 * | 2/2007 | Chu et al. | 257/77 |
| 7,230,274 B2 | 6/2007 | O'Loughlin et al. | |
| 7,235,492 B2 | 6/2007 | Samoilov | |
| 7,312,128 B2 | 12/2007 | Kim et al. | |
| 7,353,841 B2 | 4/2008 | Kono et al. | |
| 7,354,821 B2 | 4/2008 | Chung et al. | |
| 7,361,563 B2 | 4/2008 | Shin et al. | |
| 7,405,422 B2 * | 7/2008 | Chu et al. | 257/15 |
| 7,438,760 B2 * | 10/2008 | Bauer et al. | 117/89 |
| 2001/0000866 A1 | 5/2001 | Sneh et al. | |
| 2001/0020712 A1 | 9/2001 | Raaijmakers et al. | |
| 2001/0024387 A1 | 9/2001 | Raaijmakers et al. | |
| 2001/0024871 A1 | 9/2001 | Yagi | |
| 2001/0028924 A1 | 10/2001 | Sherman | |
| 2001/0034123 A1 | 10/2001 | Jeon et al. | |
| 2001/0041250 A1 | 11/2001 | Werkhoven et al. | |
| 2001/0046567 A1 | 11/2001 | Matsuki et al. | |
| 2001/0055672 A1 | 12/2001 | Todd | |
| 2002/0000598 A1 | 1/2002 | Kang et al. | |
| 2002/0016084 A1 | 2/2002 | Todd | |
| 2002/0022347 A1 | 2/2002 | Park et al. | |
| 2002/0031618 A1 | 3/2002 | Sherman | |
| 2002/0047151 A1 | 4/2002 | Kim et al. | |
| 2002/0060363 A1 | 5/2002 | Xi et al. | |
| 2002/0074588 A1 | 6/2002 | Lee | |
| 2002/0076837 A1 | 6/2002 | Hujanen et al. | |
| 2002/0090818 A1 | 7/2002 | Thilderkvist et al. | |
| 2002/0093042 A1 | 7/2002 | Oh et al. | |
| 2002/0098627 A1 | 7/2002 | Pomarede et al. | |
| 2002/0117399 A1 | 8/2002 | Chen et al. | |
| 2002/0145168 A1 | 10/2002 | Bojarczuk, Jr. et al. | |
| 2002/0155722 A1 | 10/2002 | Satta et al. | |
| 2002/0168868 A1 | 11/2002 | Todd | |
| 2002/0172768 A1 | 11/2002 | Endo et al. | |
| 2002/0173113 A1 | 11/2002 | Todd | |
| 2002/0173130 A1 | 11/2002 | Pomerede et al. | |
| 2002/0182423 A1 * | 12/2002 | Chu et al. | 428/446 |
| 2002/0197831 A1 | 12/2002 | Todd et al. | |
| 2002/0197881 A1 | 12/2002 | Ramdani et al. | |
| 2003/0013320 A1 | 1/2003 | Kim et al. | |
| 2003/0015764 A1 | 1/2003 | Raaijmakers et al. | |
| 2003/0022528 A1 | 1/2003 | Todd | |
| 2003/0032281 A1 | 2/2003 | Werkhoven et al. | |
| 2003/0036268 A1 | 2/2003 | Brabant et al. | |
| 2003/0049942 A1 | 3/2003 | Haukka et al. | |
| 2003/0060057 A1 | 3/2003 | Raaijmakers et al. | |
| 2003/0066486 A1 | 4/2003 | Zheng et al. | |
| 2003/0072884 A1 | 4/2003 | Zhang et al. | |
| 2003/0072975 A1 | 4/2003 | Shero et al. | |
| 2003/0079677 A1 * | 5/2003 | Pyi | 117/94 |
| 2003/0082300 A1 | 5/2003 | Todd et al. | |
| 2003/0089308 A1 | 5/2003 | Raaijmakers | |
| 2003/0089942 A1 | 5/2003 | Bhattacharyya | |
| 2003/0101927 A1 | 6/2003 | Raaijmakers | |
| 2003/0106490 A1 | 6/2003 | Jallepally et al. | |
| 2003/0108674 A1 | 6/2003 | Chung et al. | |
| 2003/0116804 A1 | 6/2003 | Visokay et al. | |
| 2003/0124262 A1 | 7/2003 | Chen et al. | |
| 2003/0129826 A1 | 7/2003 | Werkhoven et al. | |
| 2003/0143841 A1 | 7/2003 | Yang et al. | |
| 2003/0160277 A1 | 8/2003 | Bhattacharyya | |
| 2003/0162370 A1 | 8/2003 | Sukegawa et al. | |
| 2003/0166318 A1 | 9/2003 | Zheng et al. | |
| 2003/0172872 A1 | 9/2003 | Thakur et al. | |
| 2003/0173586 A1 | 9/2003 | Moriwaki et al. | |
| 2003/0185980 A1 | 10/2003 | Endo | |
| 2003/0186561 A1 | 10/2003 | Law et al. | |
| 2003/0188682 A1 | 10/2003 | Tois et al. | |
| 2003/0189208 A1 | 10/2003 | Law et al. | |
| 2003/0189232 A1 | 10/2003 | Law et al. | |
| 2003/0190423 A1 | 10/2003 | Yang et al. | |
| 2003/0190497 A1 | 10/2003 | Yang et al. | |
| 2003/0194853 A1 | 10/2003 | Jeon | |
| 2003/0198754 A1 | 10/2003 | Xi et al. | |
| 2003/0207555 A1 | 11/2003 | Takayanagi et al. | |
| 2003/0213560 A1 | 11/2003 | Wang et al. | |
| 2003/0213977 A1 | 11/2003 | Toyoda et al. | |
| 2003/0215570 A1 | 11/2003 | Seutter et al. | |
| 2003/0216981 A1 | 11/2003 | Tillman | |
| 2003/0224566 A1 | 12/2003 | Clampitt et al. | |
| 2003/0232554 A1 | 12/2003 | Blum et al. | |
| 2003/0235961 A1 | 12/2003 | Metzner et al. | |
| 2004/0007747 A1 | 1/2004 | Visokay et al. | |
| 2004/0009307 A1 | 1/2004 | Koh et al. | |
| 2004/0009675 A1 | 1/2004 | Eissa et al. | |
| 2004/0016973 A1 | 1/2004 | Rotondaro et al. | |
| 2004/0023462 A1 | 2/2004 | Rotondaro et al. | |

| | | | |
|---|---|---|---|
| 2004/0033674 A1 | 2/2004 | Todd | |
| 2004/0033698 A1 | 2/2004 | Lee et al. | |
| 2004/0043149 A1 | 3/2004 | Gordon et al. | |
| 2004/0043569 A1 | 3/2004 | Ahn et al. | |
| 2004/0053484 A1 | 3/2004 | Kumar et al. | |
| 2004/0161875 A1* | 8/2004 | Chu et al. | 438/105 |
| 2004/0161911 A1* | 8/2004 | Chu et al. | 438/479 |
| 2004/0171238 A1 | 9/2004 | Arena et al. | |
| 2004/0175950 A1 | 9/2004 | Puppo et al. | |
| 2004/0182423 A1 | 9/2004 | Nakao | |
| 2004/0226911 A1 | 11/2004 | Dutton et al. | |
| 2004/0235229 A1 | 11/2004 | Hokazono | |
| 2004/0253776 A1 | 12/2004 | Hoffmann et al. | |
| 2005/0054171 A1 | 3/2005 | Chu et al. | |
| 2005/0093154 A1 | 5/2005 | Kottantharayil et al. | |
| 2005/0170604 A1 | 8/2005 | Orlowski et al. | |
| 2005/0191866 A1 | 9/2005 | Powell | |
| 2005/0241671 A1 | 11/2005 | Dong et al. | |
| 2005/0263795 A1 | 12/2005 | Choi et al. | |
| 2005/0266692 A1 | 12/2005 | Brask | |
| 2005/0277272 A1 | 12/2005 | Singh et al. | |
| 2006/0057821 A1 | 3/2006 | Lee et al. | |
| 2006/0088978 A1 | 4/2006 | Clarke et al. | |
| 2006/0115933 A1* | 6/2006 | Ye et al. | 438/139 |
| 2006/0115934 A1 | 6/2006 | Kim et al. | |
| 2006/0166414 A1 | 7/2006 | Carlson et al. | |
| 2006/0234504 A1 | 10/2006 | Bauer et al. | |
| 2006/0260538 A1 | 11/2006 | Ye | |
| 2007/0108450 A1 | 5/2007 | O'Loughlin et al. | |
| 2007/0117414 A1 | 5/2007 | Moffatt | |
| 2007/0122989 A1* | 5/2007 | Chu et al. | 438/312 |
| 2007/0259112 A1 | 11/2007 | Ishikawa | |
| 2007/0286956 A1 | 12/2007 | Samoilov | |
| 2008/0022924 A1* | 1/2008 | Kim et al. | 117/85 |
| 2008/0026549 A1 | 1/2008 | Kim | |
| 2008/0044932 A1 | 2/2008 | Samoilov | |
| 2009/0026459 A1* | 1/2009 | Chu et al. | 257/65 |

FOREIGN PATENT DOCUMENTS

| | | |
|---|---|---|
| EP | 1 598 881 | 11/2005 |
| GB | 2 355 727 | 5/2001 |
| JP | 58-098917 | 6/1983 |
| JP | 60037121 | 2/1985 |
| JP | 62-171999 | 7/1987 |
| JP | 63-062313 | 3/1988 |
| JP | 63224218 | 9/1988 |
| JP | 01-143221 | 6/1989 |
| JP | 01189913 | 7/1989 |
| JP | 01-270593 | 10/1989 |
| JP | 02-172895 | 7/1990 |
| JP | 03-286522 | 12/1991 |
| JP | 05-047665 | 2/1993 |
| JP | 05-102189 | 4/1993 |
| JP | 05208897 | 8/1993 |
| JP | 05-251339 | 9/1993 |
| JP | 05347249 | 12/1993 |
| JP | 06-196809 | 7/1994 |
| JP | 07-300649 | 11/1995 |
| JP | 2001-111000 | 4/2001 |
| JP | 2001-189312 | 5/2001 |
| JP | 2001-172767 | 6/2001 |
| WO | WO 98/20524 | 5/1998 |
| WO | WO 00/16377 | 3/2000 |
| WO | WO 01/15220 | 3/2000 |
| WO | WO 00/54320 | 9/2000 |
| WO | WO 01/17692 | 3/2001 |
| WO | WO 01/29893 | 4/2001 |
| WO | WO 01/40541 | 6/2001 |
| WO | WO 01/41544 | 6/2001 |
| WO | WO 01/66832 | 9/2001 |
| WO | WO 02/43115 | 5/2002 |
| WO | WO 02/45167 | 6/2002 |
| WO | WO 02/064853 | 8/2002 |
| WO | WO 02/065508 | 8/2002 |
| WO | WO 02/065516 | 8/2002 |
| WO | WO 02/065517 | 8/2002 |
| WO | WO 02/065525 | 8/2002 |
| WO | WO 02/080244 | 10/2002 |
| WO | WO 02/097864 | 12/2002 |
| WO | WO 2004/027844 | 4/2004 |
| WO | WO 2005/071719 | 8/2005 |
| WO | WO2006/060543 | 6/2006 |
| WO | WO 2007/112058 | 10/2007 |
| WO | WO2008/033186 | 3/2008 |

OTHER PUBLICATIONS

International Preliminary Report on Patentability and Written Opinion of International Application No. PCT/US07/17193 mailed Feb. 12, 2009.

Argarwal, et al., "Challenges in Integrating the High-K Gate Dielectric Film to the Conventional CMOS Process Flow," Mat. Sec. Soc. Sump. Proc. vol. 670 (2001) pp. K2.1.1-K2.1.11.

Bedair, S.M., "Atomic Layer Epitaxy Deposition Processes," J. Vac. Sci. Technol. B., vol. 12, No. 1, Jan./Feb. 1994.

Choi, et al., "Stability of TiB2 as a Diffusion Barrier on Silicon," J. Electrochem. Soc., vol. 138, No. 10, Oct. 1991.

Choi, et al., The Effect of Annealing on Resistivity of Low Pressure Chemical Vapor Deposited Titanium Diboride, J. Appl. Phys. 69(11), Jun. 1, 1991.

Derbyshire, K., "Applications of Integrated Processing," Solid State Technology, Dec. 1994 pp. 45-48.

Elers, et al., "NbCl5 as a Precursor in Atomic Layer Epitaxy," Applied Surface Science 82/83 (1994) pp. 468-474.

George, et al., "Surface Chemistry for Atomic Layer Growth," J. Phys. Chem. 1996, 100, pp. 13121-13131.

Hwang, et al., "Nanometer-Size a-PbO2-Type TiO2 in Garnet: A Thermobarometer for Ultrahigh Pressure Metamorphism," Science Vo. 288 (Apr. 14, 2000) pp. 321-324.

Jeong, et al., "Growth and Characterization of Aluminum Oxide (Al2O3) Thin Films by Plasma Assisted Atomic Layer Controlled Deposition," J. Korean Inst. Met. Mater., vol. 38, No. 10, Oct. 2000 pp. 1395-1399.

Jeong, et al., "Plasma-assisted Atomic Layer Growth of High-Quality Aluminum Oxide Thin Films," Jpn. J. Appl. Phys. 1, Regul. Pap. Short Notes, vol. 40, No. 1, Jan. 2001 pp. 285-289.

Lee, et al., "Cyclic Technique for the Enhancement of Highly Oriented Diamond Film Growth," Thin Solid Films 303 (1997) pp. 264-269.

Min, et al., "Chemical Vapor Deposition of Ti-Si-N Films with Alternating Source Supply," Mat. Res. Soc. Symp. Proc. vol. 564 (1999) pp. 207-210.

Min, et al., "Metal-organic Atomic-layer Deposition of Titanium-silicon-nitride Films," Applied Physics Letters, vol. 75, No. 11 (Sep. 11, 1999) pp. 1521-1523.

Paranjpe, et al., "Atomic Layer Deposition of AlOx for Thin Film Head Gap Applications," J. Electrochem. Soc., vol. 148, No. 9, Sep. 2001 pp. G465-G471.

Ritala, et al., "Atomic Layer Deposition of Oxide Thin Films with Metal Alkoxides as Oxygen Sources," Science vol. 288 Apr. 14, 2000 pp. 319-321.

Kamins, et al., "Kinetics of selective epitaxial deposition of Si1-xGex", Applied Physics Letters, American Institute of Physics. New York, US, vol. 61, No. 6, Aug. 10, 1992, pp. 669-671.

Menon, et al., "Loading effect in SiGe layers grown by dichlorosilane- and silane-based epitaxy", Journal of Applied Physics, American Institute of Physics. New York, US, vol. 90, No. 9, Nov. 1, 2001, pp. 4805-4809.

Sedgwick, et al., "Selective SiGe and heavily As doped Si deposited at low temperature by atmospheric pressure chemical vapor deposition", Journal of Vacuum Science and Technology: Part B, American Institute of Physics. New York, US, vol. 11, No. 3, May 1, 1993, pp. 1124-1128.

Uchino, et al., "A Raised Source/Drain Technology Using In-situ P-doped SiGe and B-doped Si for 0.1 µm CMOS ULSIs", Electron Devices Meeting, 1997. Technical Digest, International Washington, DC, USA Dec. 7-10, 1991, New York, NY, USA, IEEE, US, Dec. 7, 1997, pp. 479-482.

Maruno et al., "Selective Epitaxial Growth by Ultrahigh-Vacuum Chemical Vapor Deposition with Alternating Gas Supply of Si2H6 and Cl2", Nov. 2000, Jpn. J. Appl. Phys. vol. 39, Part 1, No. 11, pp. 6139-6142.

Kim et al., "Low temperature selectivity Si epitaxy by reduced pressure chemical vapor deposition introducing periodic deposition and etching cycles with SiH4, H2 and HCl", Mat. Res. Soc. Symp. Proc., pp. A8.2.I-A8.2,6 (2000).

Mercier, et al., Kinetic Aspects of Selective Epitaxial Growth Using a Rapid Thermal Processing Journal or Crystal Growth, 94, pp. 885-894 (1989).

Miyauchi, et al., "Low-Temperature (850° C.) Silicon Selective Epitaxial Growth on HF-Treated Si(I00) Substrates UsingSiH4-HCl-H2 Systems", J. Electrochem. Soc., vol. 138, No. 11, Nov. 1991, pp. 3480-3483.

Ribot, et al., "Low-temperature selective epitaxy of silicon with chlorinated chemistry by RTCVD", Materials Science and Engineering B89, pp. 306-309 (2002).

International Search Report and Written Opinion of International Application No. PCT/US07/17193 mailed Jan. 31, 2008.

Waite, A.M. et al., "Raised Source/Drains for 50nm MOSFETS Using a Silane/Discholorosilane Mixture for Selective Epitaxy", Received on Jan. 7, 2004, Elsevier Ltd.—Solid-State Electronics 49 (2005), pp. 529-534.

* cited by examiner

METHODS OF FORMING CARBON-CONTAINING SILICON EPITAXIAL LAYERS

The present application claims priority to U.S. Provisional Patent Application Ser. No. 60/834,773 filed Jul. 31, 2006, and entitled "METHODS OF FORMING CARBON-CONTAINING SILICON EPITAXIAL LAYERS" which is hereby incorporated herein by reference in its entirety for all purposes.

CROSS REFERENCE TO RELATED APPLICATIONS

The present application is related to the following co-pending applications, each of which is hereby incorporated by reference herein in its entirety:

U.S. patent application Ser. No. 11/001,774, filed Dec. 1, 2004; and

U.S. patent application Ser. No. 11/227,974, filed Sep. 14, 2005.

FIELD OF THE INVENTION

The present invention relates to semiconductor device manufacturing, and more specifically to methods of forming carbon-containing silicon epitaxial layers.

BACKGROUND

As smaller transistors are manufactured, ultra shallow source/drain junctions are becoming more challenging to produce. Generally, sub-100 nm CMOS (complementary metal-oxide semiconductor) devices require a junction depth to be less than 30 nm. Selective epitaxial deposition is often utilized to form epilayers of silicon-containing materials (e.g., Si, SiGe and SiC) into the junctions. Generally, selective epitaxial deposition permits growth of epilayers on silicon moats with no growth on dielectric areas. Selective epitaxy can be used within semiconductor devices, such as elevated source/drains, source/drain extensions, contact plugs or base layer deposition of bipolar devices.

Generally, a selective epitaxy process involves a deposition reaction and an etch reaction. The deposition and etch reactions occur simultaneously with relatively different reaction rates to an epitaxial layer and to a polycrystalline layer. During the deposition process, the epitaxial layer is formed on a monocrystalline surface while a polycrystalline layer is deposited on at least a second layer, such as an existing polycrystalline layer and/or an amorphous layer. However, the deposited polycrystalline layer is generally etched at a faster rate than the epitaxial layer. Therefore, by changing the concentration of an etchant gas, the net selective process results in deposition of epitaxy material and limited, or no, deposition of polycrystalline material. For example, a selective epitaxy process may result in the formation of an epilayer of silicon-containing material on a monocrystalline silicon surface while no deposition is left on a spacer.

Selective epitaxy deposition of silicon-containing materials has become a useful technique during formation of elevated source/drain and source/drain extension features, for example, during the formation of silicon-containing MOSFET (metal oxide semiconductor field effect transistor) devices. Source/drain extension features are manufactured by etching a silicon surface to make a recessed source/drain feature and subsequently filling the etched surface with a selectively grown epilayer, such as a silicon germanium (SiGe) material. Selective epitaxy permits near complete dopant activation with in-situ doping, so that the post annealing process is omitted. Therefore, junction depth can be defined accurately by silicon etching and selective epitaxy. On the other hand, the ultra shallow source/drain junction inevitably results in increased series resistance. Also, junction consumption during silicide formation increases the series resistance even further. In order to compensate for junction consumption, an elevated source/drain is epitaxially and selectively grown on the junction. Typically, the elevated source/drain layer is undoped silicon.

However, current selective epitaxy processes have some drawbacks. In order to maintain selectivity during present epitaxy processes, chemical concentrations of the precursors, as well as reaction temperatures must be regulated and adjusted throughout the deposition process. If not enough silicon precursor is administered, then the etching reaction may dominate and the overall process is slowed down. Also, harmful over etching of substrate features may occur. If not enough etchant precursor is administered, then the deposition reaction may dominate reducing the selectivity to form monocrystalline and polycrystalline materials across the substrate surface. Also, current selective epitaxy processes usually require a high reaction temperature, such as about 800° C., 1,000° C. or higher. Such high temperatures are not desirable during a fabrication process due to thermal budget considerations and possible uncontrolled nitridation reactions to the substrate surface. Furthermore, some epitaxial films and/or processes are prone to morphological deficiencies such as pitting or surface roughness in the films.

Therefore, there is a need to have a process for selectively and epitaxially depositing silicon and silicon-containing compounds. Furthermore, the process should be versatile to form silicon-containing compounds with varied elemental concentrations while having a fast deposition rate and maintaining a process temperature, such as about 800° C. or less. Finally, the process should result in a low defect film or film stack (e.g., with little pitting, dislocations, roughness, point defects, etc.).

SUMMARY OF THE INVENTION

In a first aspect of the invention, a method is provided for forming an epitaxial layer stack on a substrate. The method includes (1) selecting a target carbon concentration for the epitaxial layer stack; (2) forming a carbon-containing silicon layer on the substrate, the carbon-containing silicon layer having at least one of an initial carbon concentration, a thickness and a deposition time selected based on the selected target carbon concentration; and (3) forming a non-carbon-containing silicon layer on the carbon-containing silicon layer prior to etching.

In a second aspect of the invention, a method is provided for forming an epitaxial layer stack. The method includes (1) selecting a target carbon concentration for the epitaxial layer stack; and (2) forming the epitaxial layer stack by depositing alternating carbon-containing silicon layers and non-carbon-containing silicon layers. The target carbon concentration is achieved based on at least one of a total thickness, an initial carbon concentration, and a deposition time for the carbon-containing silicon layers.

In a third aspect of the invention, a method is provided for controlling carbon concentration in an epitaxial layer stack formed on a substrate. The method includes (1) determining a desired carbon concentration for the epitaxial layer stack; and (2) forming the epitaxial layer stack by (a) forming a carbon-containing epitaxial layer on the substrate; and (b) forming a non-carbon-containing cap layer on the carbon-containing epitaxial layer. A thickness of the carbon-containing epitaxial layer is selected based on the desired carbon concentration for the epitaxial layer stack. Numerous other aspects are provided.

Other features and aspects of the present invention will become more fully apparent from the following detailed description, the appended claims and the accompanying drawings.

DETAILED DESCRIPTION

During a selective epitaxial growth process on a silicon substrate patterned with dielectric films, formation of single-crystal semiconductor occurs only on exposed silicon surfaces (e.g., not on dielectric surfaces). Selective epitaxial growth processes may include simultaneous etch-deposition processes as well as alternating gas supply processes. In a simultaneous etch-deposition process, both etchant species and deposition species are flowed simultaneously. As such, an epitaxial layer is simultaneously deposited and etched during its formation.

In contrast, previously incorporated U.S. patent application Ser. No. 11/001,774, filed Dec. 1, 2004, describes an alternating gas supply (AGS) process for forming epitaxial layers on a substrate. During an AGS process, an epitaxial deposition process is conducted on a substrate, and then an etching process is conducted on the substrate. The cycle of an epitaxial deposition process followed by an etching process is repeated until a desired thickness of an epitaxial layer is formed.

A deposition process may include exposing the substrate surface to a deposition gas containing at least a silicon source and a carrier gas. The deposition gas may also include a germanium source and/or a carbon source, as well as a dopant source. Common dopants may include arsenic, boron, phosphorus, antimony, gallium, aluminum and other elements.

During the deposition process, an epitaxial layer is formed on the monocrystalline surface(s) of the substrate while a polycrystalline layer is formed on secondary surfaces, such as amorphous and/or polycrystalline surfaces. Subsequently, the substrate is exposed to an etching gas. The etching gas includes a carrier gas and an etchant. The etching gas removes silicon-containing materials deposited during the deposition process. During the etching process, the polycrystalline layer is removed at a faster rate than the epitaxial layer. Therefore, the net result of the deposition and etching processes forms epitaxially grown silicon-containing material on monocrystalline surfaces while minimizing growth, if any, of polycrystalline silicon-containing material on the secondary surfaces. Exemplary silicon-containing materials which can be deposited include silicon, silicon germanium, silicon carbon, silicon germanium carbon, dopant variants thereof and the like.

Conventional silicon epitaxial film formation processes employ hydrogen ($H_2$), hydrogen chloride (HCl) and a silicon source such as dichlorosilane and are performed at a substrate temperature above about 700 degrees Celsius (e.g., to dissociate HCl and/or the silicon source). One approach to reduce the epitaxial film formation temperature is to employ chlorine ($Cl_2$) in place of HCl, as $Cl_2$ dissociates efficiently at lower temperatures (e.g., about 600 degrees Celsius or less). Because of incompatibility between hydrogen and $Cl_2$, a carrier gas other than hydrogen, such as nitrogen, may be employed with $Cl_2$. Similarly, a silicon source having a lower dissociation temperature may be employed (e.g., silane ($SiH_4$), disilane ($Si_2H_6$), etc.).

The use of $Cl_2$ as the etchant gas for a silicon epitaxial film formation process may lead to poor surface morphology of the resultant silicon epitaxial film. While not wishing to be bound by any particular theory, it is believed that $Cl_2$ may over aggressively attack a silicon epitaxial film surface, producing pitting or the like. The use of $Cl_2$ has been found to be particularly problematic when the silicon epitaxial film contains carbon.

The present invention provides methods for employing $Cl_2$ as an etchant gas during a silicon epitaxial film formation process that may improve epitaxial film surface morphology. The inventive methods may be used, for example, with the alternating gas supply (AGS) process described in U.S. patent application Ser. No. 11/001,774, filed Dec. 1, 2004.

In some embodiments, any carbon-containing silicon epitaxial films may be "encapsulated" prior to being exposed to $Cl_2$ during an etch phase. A carbon-containing silicon epitaxial film may be encapsulated, for example, via a silicon epitaxial film formed without a carbon source (a "non-carbon-containing silicon epitaxial film").

Figure 1A:
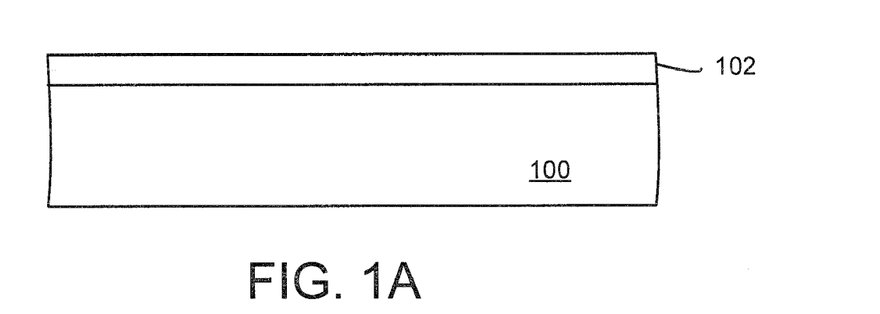
FIGS. 1A-1D illustrate cross-sectional views of a substrate during formation of an epitaxial layer stack in accordance with the present invention.

As an example, formation of a carbon-containing silicon epitaxial layer stack in accordance with the present invention, and employing an AGS process, is described below with reference to FIGS. 1A-1D. With reference to FIG. 1A, a cross-sectional view of a substrate 100 is illustrated having a seed epitaxial layer 102 (e.g., a silicon (Si) epitaxial layer) formed on the substrate 100. In some embodiments, the seed epitaxial layer 102 may be eliminated.

To form the seed epitaxial layer 102, the substrate 100 may be placed in a processing chamber, and heated to a desired substrate and/or process temperature. An exemplary epitaxial film chamber may be found in the Epi Centura® system and the Poly Gen® system available from Applied Materials, Inc., located in Santa Clara, Calif., although other epitaxial film chambers and/or systems may be used. In at least one embodiment of the invention, a substrate and/or process temperature of less than about 700 degrees Celsius may be employed to improve carbon incorporation within any silicon epitaxial layer formed within the process chamber. In a particular embodiment, a substrate and/or process temperature range of between about 550 to 650 degrees Celsius may be used, and in yet another embodiment, a substrate and/or process temperature of less than about 600 degrees Celsius may be used. Other substrate and/or process temperatures may be used, including substrate and/or process temperatures above 700 degrees Celsius.

After the desired substrate and/or process temperature has been reached, the substrate 100 is exposed to at least a silicon source (without a carbon source) so as to form the seed epitaxial layer 102. For example, the substrate 100 may be exposed to a silicon source such as silane or disilane, and a carrier gas such as nitrogen. A dopant source such as phosphorous or boron, a germanium source or the like also may be used (as may any other suitable sources and/or gasses). During the epitaxial film formation process, the epitaxial layer 102 may be formed on any monocrystalline surface of the substrate 100 while a polycrystalline layer may be formed on any polycrystalline layer and/or any amorphous layer present on the substrate 100 (as previously described).

The seed epitaxial layer 102 may be formed, for example, by flowing a silicon source at a flow rate of about 50-150 sccm for silane (or a flow rate of about 10-40 sccm for disilane) and a nitrogen carrier gas at a flow rate of about 20-25 slm (although larger or smaller silicon source and/or carrier gas flow rates may be used). HCl may also be flowed if desired.

In at least one embodiment, the seed epitaxial layer 102 may have a thickness of about 2 angstroms to about 100 angstroms, although other thicknesses may be used. For example, a deposition time of about 1 second to about 100 seconds, and in one or more embodiments about 5 seconds, may be used.

After the seed epitaxial layer 102 is formed (if used at all), the substrate 100 is exposed to at least a silicon source and a carbon source so as to form a carbon-containing silicon epitaxial layer 104 (FIG. 1B) on the substrate 100 over the seed epitaxial layer 102. For example, the substrate 100 may be exposed to a silicon source such as silane or disilane, a carbon source such as methane, and a carrier gas such as nitrogen. A dopant source such as phosphorous or boron, a germanium source or the like also may be used (as may any other suitable sources and/or gasses). During the epitaxial film formation process, a carbon-containing epitaxial layer may be formed on any monocrystalline surface of the substrate 100 while a polycrystalline layer may be formed on any polycrystalline layer and/or any amorphous layer present on the substrate 100 (as previously described).

Figure 1B:
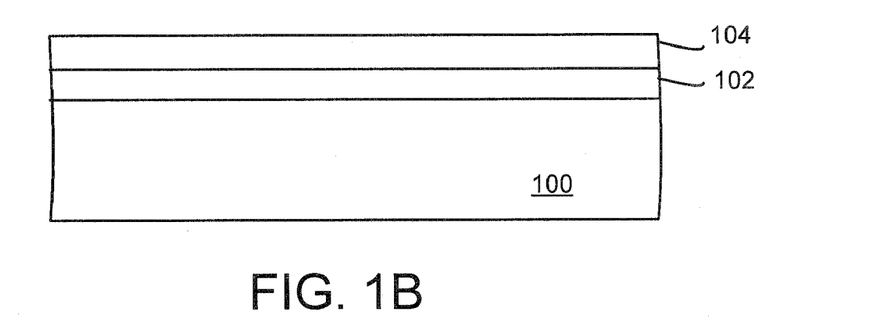

In at least one embodiment, a carbon source flow rate of approximately 1-5 sccm for methane may be used with a silicon source at a flow rate of about 50-150 sccm for silane (or of about 10-40 sccm for disilane) and a nitrogen carrier gas at a flow rate of about 20-25 slm (although larger or smaller silicon source and/or carrier gas flow rates may be used). HCl may also be flowed if desired.

The carbon-containing epitaxial layer 104 may have, for example, a thickness of about 2 angstroms to about 100 angstroms, although other thicknesses may be used. For example, a deposition time of about 1 second to about 50 seconds, and in one or more embodiments about 10 seconds, may be used.

Figure 1C:
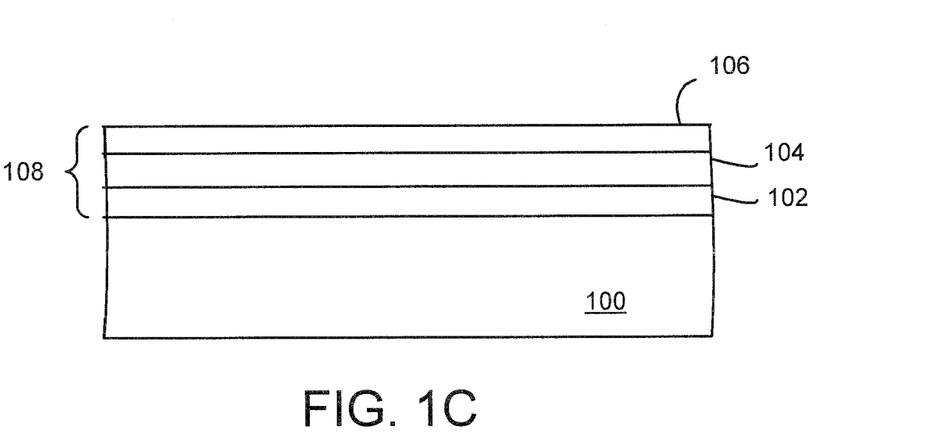

After the carbon-containing silicon epitaxial layer 104 is formed, the substrate 100 is exposed to at least a silicon source (without a carbon source) so as to form a second silicon epitaxial layer 106 (e.g., a capping layer as shown in FIG. 1C) on the substrate 100 over the carbon-containing silicon epitaxial layer 104. For example, the substrate 100 may be exposed to a silicon source such as silane or disilane, and a carrier gas such as nitrogen. A dopant source such as phosphorous or boron, a germanium source or the like also may be used (as may any other suitable sources and/or gasses). The presence of the second silicon epitaxial layer 106 over the carbon-containing silicon epitaxial layer 104 may diminish the interaction of chlorine with carbon (and/or hydrogen) in the carbon-containing silicon epitaxial layer 104. HCl may also be flowed as described previously.

The second silicon epitaxial layer 106 may be formed, for example, by flowing a silicon source at a flow rate of about 50-150 sccm for silane (or a flow rate of about 10-40 sccm for disilane) and a nitrogen carrier gas at a flow rate of about 20 to 25 slm (although larger or smaller silicon source and/or carrier gas flow rates may be used). HCl may also be flowed.

In at least one embodiment, the second silicon epitaxial layer 106 may have a thickness of about 2 angstroms to about 100 angstroms, although other thicknesses may be used. For example, a deposition time of about 1 second to about 100 seconds, and in one or more embodiments about 5 seconds, may be used.

An epitaxial layer stack 108 thereby is formed, in which the carbon-containing epitaxial layer 104 is encapsulated between non-carbon-containing epitaxial layers 102, 106 (e.g., epitaxial layers that are formed without an intentional carbon source).

After formation of the second silicon epitaxial layer 106, the substrate 100 may be exposed to Cl2 and/or another etchant so as to etch at least the second silicon epitaxial layer 106, and/or any other films formed on the substrate 100 (e.g., polycrystalline silicon formed on polycrystalline and/or amorphous layers present on the substrate 100 and/or monocrystalline silicon formed on the carbon-containing silicon epitaxial layer 104). For example, in at least one embodiment, the substrate 100 may be exposed to a Cl2 flow rate of about 30-50 sccm and a nitrogen carrier gas flow rate of 20 slm (although larger or smaller Cl2 and/or nitrogen carrier gas flow rates may be used). HCl may also be flowed.

Following etching, the process chamber being employed may be purged (e.g., with nitrogen and/or another inert gas for about 20 seconds or for some other suitable time period) to remove any Cl2 and/or any other unwanted species/by-products from the chamber.

The cap epitaxial layer 106 and/or seed layer 102 prevent a reaction from occurring between an etchant and carbon in the carbon-containing epitaxial layer 104. As such, $Cl_2$ may be employed as the etchant because the underlying carbon-containing layer is not exposed to the $Cl_2$ during etching. Accordingly, the carbon-containing epitaxial layer 102 will not have a pitted surface morphology, but rather a smooth surface morphology.

Figure 1D:
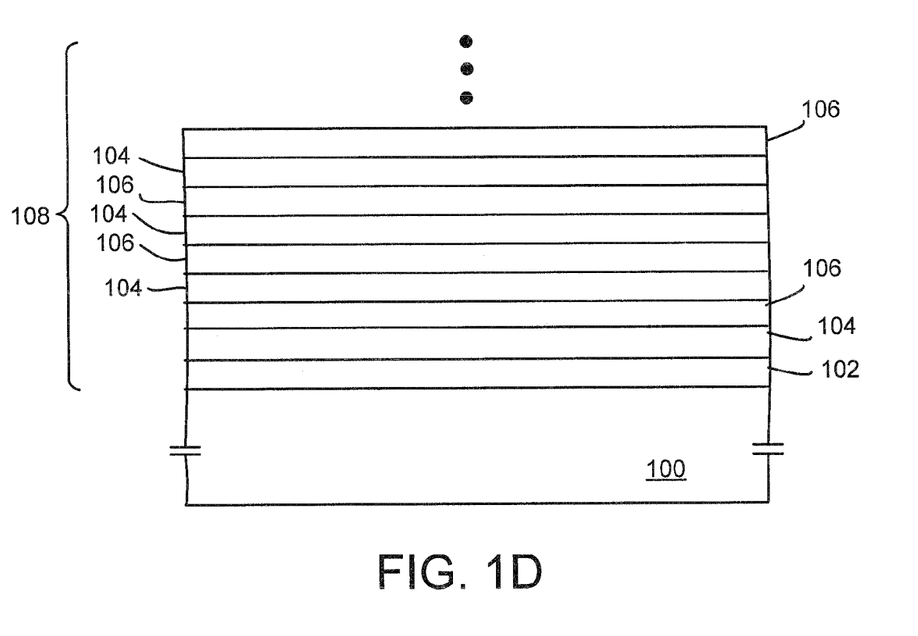

Deposition and etching sequences may be repeated until the desired total epitaxial layer stack thickness is achieved as shown, for example, in FIG. 1D. For example, the sequence of non-carbon-containing silicon layer deposition/carbon-containing silicon layer deposition/non-carbon-containing silicon layer deposition/etching may be repeated about 80 times to yield a total epitaxial layer stack thickness of about 600 Å. In other embodiments, deposition of an underlying seed layer may be eliminated, so that the formation sequence may be carbon-containing silicon layer deposition/non-carbon-containing silicon layer deposition/etching repeated a number of times to yield the desired total epitaxial layer stack thickness.

While the above examples illustrate particular embodiments, in general, the epitaxial layer stack (which includes carbon-containing epitaxial layers and non-carbon-containing epitaxial layers) may have a thickness in a range from about 10 Å to about 2,000 Å, preferably from about 100 Å to about 1,500 Å, and more preferably from about 300 Å to about 1,000 Å. In one particular embodiment, a layer stack of about 600 Å may be used.

By controlling the (1) film thickness of the encapsulated carbon-containing epitaxial layer(s) relative to the non-carbon-containing epitaxial material; and (2) carbon concentration in the carbon-containing epitaxial layer(s), average carbon concentration of the final epitaxial layer stack may be controlled and/or determined. For example, in some embodiments, the carbon in the carbon-containing epitaxial layer(s) may quickly and uniformly diffuse along a depth of the stacked layers (e.g., the seed layer, carbon-containing layer and cap layer), even though carbon is only deposited during the carbon-containing epitaxial layer formation step.

Figure 2:
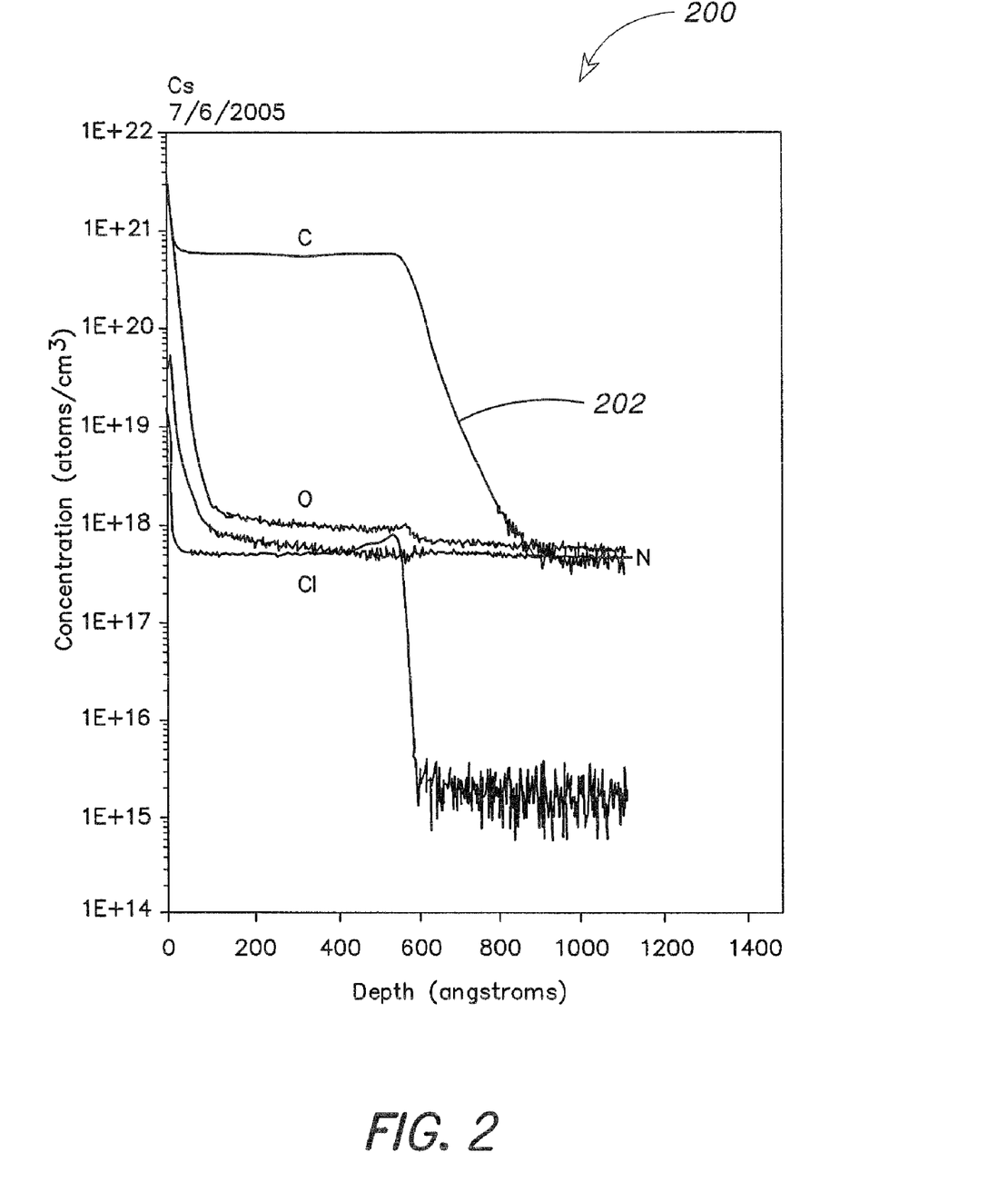
FIG. 2 is a graph illustrating a concentration of carbon throughout stacked layers of a non-carbon-containing seed epitaxial layer, a carbon-containing epitaxial layer and a non-carbon-containing cap epitaxial layer formed in accordance with the present invention.

FIG. 2 is a graph 200 illustrating a concentration of carbon throughout stacked layers of a non-carbon-containing seed epitaxial layer, a carbon-containing epitaxial layer and a non-carbon-containing cap epitaxial layer formed in accordance with the present invention (such as in FIG. 1C). As may be seen with reference to FIG. 2, a concentration of carbon, generally indicated by a line 202, is uniformly distributed throughout a depth of the stacked layers, (where the X-axis represents a depth of the stacked layers and the Y-axis represents carbon distribution throughout the stacked layers). As such, according to some embodiments of the present invention, the concentration of carbon within the stacked layers may be controlled by controlling the relative thicknesses of the carbon-containing layer and/or of the seed and/or cap layers, as well as initial carbon concentration within the carbon-containing layer.

Figure 3:
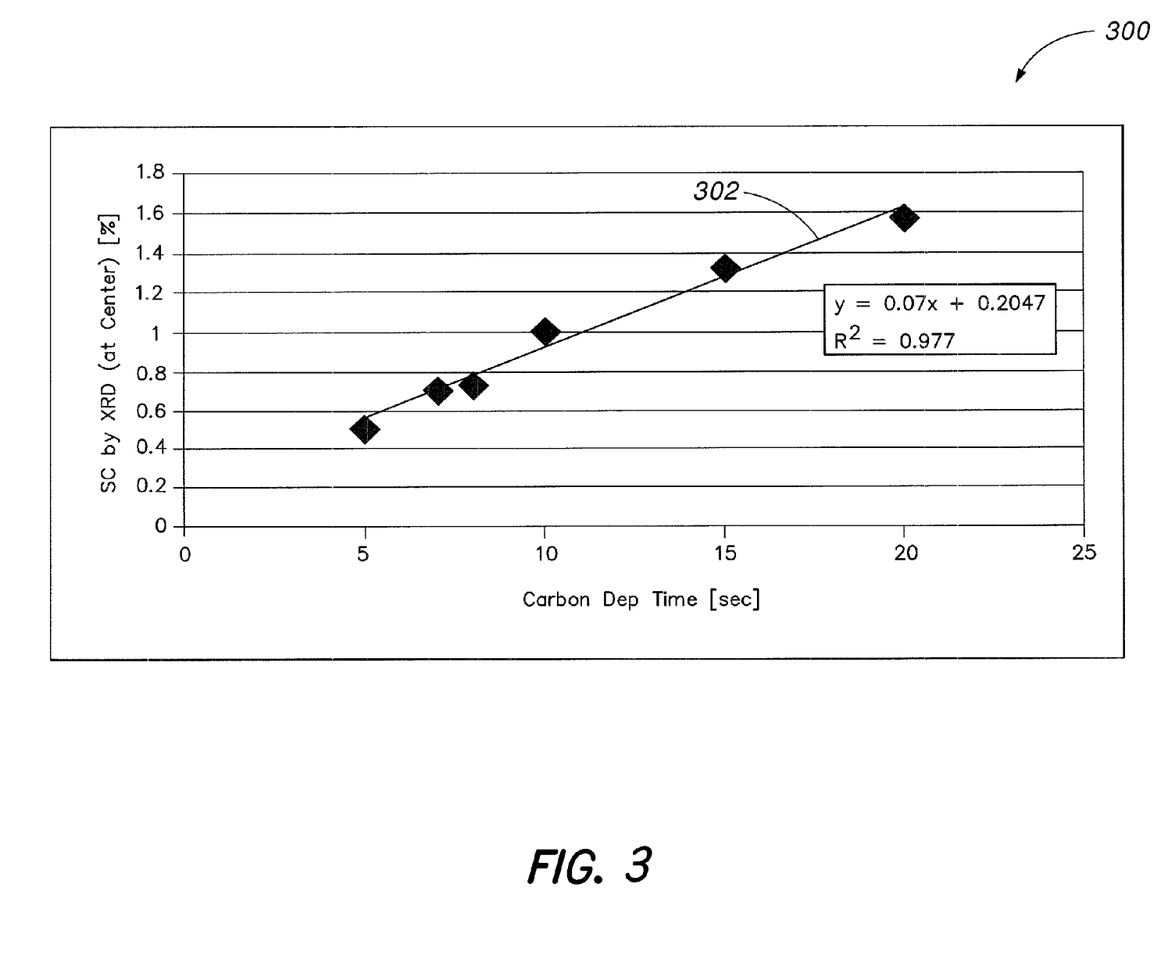
FIG. 3 is a graph illustrating the dependence of substitutional carbon (SC) concentration on the deposition time of a carbon-containing epitaxial layer for fixed deposition times of seed and cap epitaxial layers in accordance with the present invention.

In some embodiments, final carbon concentration can be estimated from the relative thickness of the carbon-containing epitaxial layer to the non-carbon-containing epitaxial layer(s). For example, FIG. 3 is a graph 300 illustrating the dependence of substitutional carbon (SC) concentration on the deposition time of the carbon-containing epitaxial layer for fixed deposition times of the seed and cap layers (e.g., in FIG. 1C). As may be seen with reference to line 302 in FIG. 3, the concentration of carbon within the stack layers is proportional to the deposition time of the carbon-containing epitaxial layer. Thus, according to some embodiments of the present invention, the concentration of carbon within a seed layer/carbon-containing layer/cap layer stack or "sandwich" may be controlled by controlling the deposition time of the carbon-containing epitaxial layer.

In one or more embodiments, the target carbon concentration of an epitaxial layer stack may be in the range from about 200 parts per million (ppm) to about 5 atomic percent (at %), preferably from about 0.5 at % to about 2 at %, for example about 1.5 at %. Other target concentrations may be used. In some embodiments, the carbon concentration may be graded within an epitaxial layer (such as layer 104 in FIGS. 1A-1D).

Carbon incorporated in carbon-containing silicon layers is generally located in interstitial sites of the crystalline lattice immediately following the deposition of the silicon-containing layer. The initial carbon concentration, or in other words, the as-deposited carbon content in a carbon-containing layer may be about 10 at % or less, preferably less than about 5 at % and more preferably from about 0.5 at % to about 3 at %, for example, about 2 at %. Either by annealing (described below) or by natural diffusion during (subsequent) process steps, an epitaxial layer may incorporate at least a portion, if not all of the interstitial carbon into substitutional sites of the crystalline lattice. The total carbon concentration of the epitaxial layer stack includes all carbon, whether interstitially or substitutionally incorporated in the stack. High resolution X-ray diffraction (XRD) may be used to determine substitutional carbon concentration and thickness. Secondary Ion Mass Spectroscopy (SIMS) may be used to determine the total (substitutional and interstitial) carbon concentration in the epitaxial layer stack. Substitutional carbon concentration may be equal to or lower than the total carbon concentration. A suitable annealing process may include a spike anneal, such as a rapid thermal process (RTP), laser annealing or thermal annealing with an atmosphere of gas, such as oxygen, nitrogen, hydrogen, argon, helium or combinations thereof. In some embodiments, an annealing process may be conducted at a temperature from about 800° C. to about 1,200° C., preferably from about 1,050° C. to about 1,100° C. Such an annealing process may occur immediately after the capping non-carbon-containing layer 106 is deposited or after a variety of other process steps (e.g., such as after the entire film stack is deposited).

Figure 4:
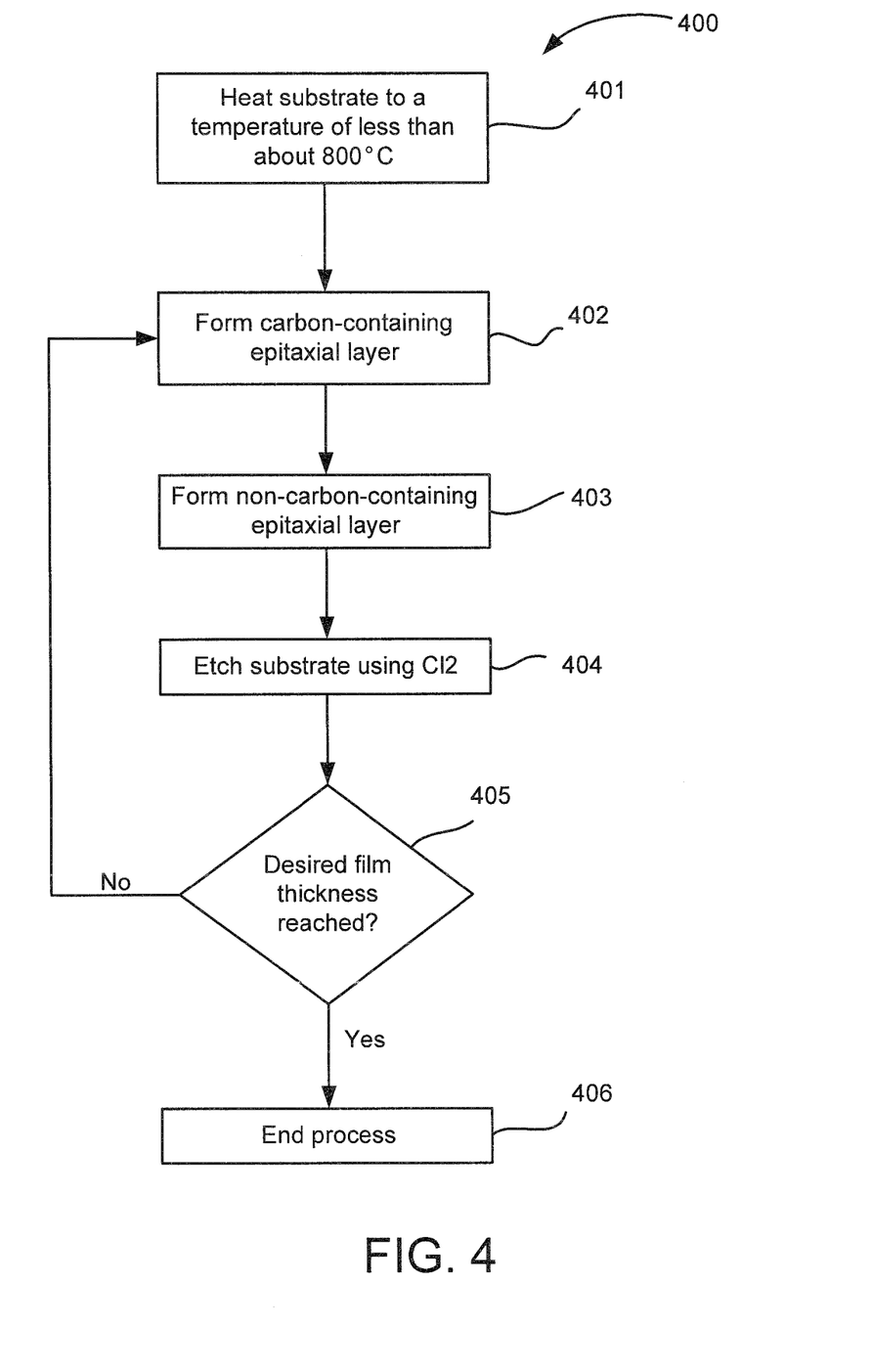
FIG. 4 is a flowchart of an exemplary method for forming an epitaxial layer stack having a target carbon concentration in accordance with the present invention.

FIG. 4 is a flowchart of an exemplary method 400 for forming an epitaxial layer stack having a target carbon concentration in accordance with the present invention. With reference to FIG. 4, in step 401, a substrate is loaded into a process chamber and is heated to a temperature of about 800° C. or less. In some embodiments, a lower temperature range may be used during epitaxial film formation, such as less than 750° C., less than 700° C. or less than 650° C. (such as about 600° C. or less).

In step 402, a carbon-containing epitaxial layer is formed on the substrate. The initial carbon concentration, thickness and/or deposition time of the carbon-containing epitaxial layer may be selected based on the target carbon concentration for the epitaxial layer stack. Thereafter, in step 403 a non-carbon-containing epitaxial layer is formed on the carbon-containing epitaxial layer. In some embodiments, the non-carbon-containing epitaxial layer is thick enough to protect the underlying carbon-containing layer from subsequent etching.

In step 404, the substrate is etched using an etchant gas such as HCl and/or $Cl_2$. As stated, the non-carbon-containing epitaxial layer protects the underlying carbon-containing epitaxial layer from the etchant gas. A purge step (not shown) may be employed following etching so as to remove any etchant gas and/or other undesirable gases from the process chamber being employed.

In step 405, a determination is made whether the desired epitaxial layer stack thickness has been reached. If so, the process ends in step 406; otherwise, the process returns to step 402 to deposit additional epitaxial material on the substrate.

In another exemplary embodiment, a process cycle may include (1) a non-carbon-containing silicon (Si) layer deposition step; (2) a carbon-containing silicon (Si:C) layer deposition step; (3) a non-carbon-containing silicon (Si) layer deposition step; (4) an etch step; and (5) a purge step. The process cycle may be repeated numerous times to achieve an overall epitaxial layer stack thickness. In one particular embodiment, the process cycle may be repeated about 80 times to obtain about 600 angstroms of epitaxial material for an epitaxial layer stack. In this case, each deposition of Si or Si:C may result in about 5 to 30 angstroms of epitaxial material, a portion of which is etched away by a subsequent etch step (e.g., about 15-25 angstroms). After about 80 repetitions, the remaining epitaxial material (e.g., on a Si moat) may be about 600 angstroms (with little or no deposition on dielectric regions of the substrate). In other embodiments, an epitaxial layer stack thickness range of about 30 to 100 nanometers may be used.

In some embodiments, a substitutional carbon concentration range for an epitaxial layer stack and/or for an as-deposited Si:C layer may be about 0.5-2.0 at %. When the Si:C layer is sandwiched within Si layers, the total stack carbon concentration is reduced depending on the thickness of the Si layers compared to thickness of the Si:C layer. Depending on process conditions, substitutional carbon concentration may be equal to or lower than total carbon concentration.

Exemplary gas flow ranges include silicon source flow rates of about 5-500 sccm for dichlorosilane, silane, disilane, or high order silane, carbon source flow rates of about 1-30 sccm for mono methylsilane, and carrier gas flow rates of about 3-30 slm for H2 or N2. During etching, an exemplary flow rate for HCl is about 20-1000 sccm and for Cl2 is about 10-500 sccm.

In one particular embodiment, HCl may be flowed during each process step (except the purge step) at approximately the same flow rate (e.g., about 300 sccm or another suitable rate), and Cl2 may be flowed only during the etching step (e.g., at about 30 sccm or another suitable rate). Disilane may be flowed during each deposition step (e.g., at about 7 sccm or another suitable rate), and methylsilane may be flowed during the Si:C deposition step (e.g., at about 2.2 sccm or another suitable rate). N2 carrier gas may be flowed at about 20 slm or another suitable rate during each process cycle step, and increased to about 30 slm or another suitable rate during each purge step. In some embodiments, about 5 angstroms of Si may be deposited during the first Si deposition step (e.g., about a 4 second deposition), about 9 angstroms of Si:C may be deposited during the Si:C deposition step (e.g., about a 7 second deposition), about 13 angstroms of Si may be deposited during the second Si deposition step (e.g., about a 10 second deposition), and about 19 angstroms of epitaxial material may be removed during the etching step (e.g., about a 13 second etch). A suitable purge time may be used (e.g., about 10 seconds). A process temperature of about 600° C. and a chamber pressure of about 10 Torr during deposition and purging, and about 13 Torr during etching may be employed. As stated, other process conditions may be used.

The foregoing description discloses only exemplary embodiments of the invention. Modifications of the above disclosed apparatus and methods which fall within the scope of the invention will be readily apparent to those of ordinary skill in the art. Accordingly, while the present invention has been disclosed in connection with exemplary embodiments thereof, it should be understood that other embodiments may fall within the spirit and scope of the invention, as defined by the following claims.

The invention claimed is:

1. A method of forming an epitaxial layer stack on a substrate, the epitaxial layer stack comprising a desired thickness and a target carbon concentration, the method comprising:
   (a) forming a first silicon layer on the substrate, the first silicon layer comprising carbon-containing silicon;
   (b) forming a second silicon layer on the first silicon layer, wherein the second silicon layer comprises non-carbon-containing silicon;
   (c) causing carbon from the first silicon layer to distribute to the second silicon layer;
   (d) etching the epitaxial layer stack to remove a portion of the second silicon layer;
   (e) repeating steps (a) through (d) until the etched epitaxial layer stack has the desired thickness; and
   (f) controlling one or more of: (i) an initial carbon concentration, (ii) a thickness and (iii) a deposition time of the first silicon layers to achieve the target carbon concentration of the etched epitaxial layer stack.

2. The method of claim 1 wherein the target carbon concentration is between about 200 ppm and 5 at %.

3. The method of claim 1 wherein the initial carbon concentration is between about 0.5 at % and 10 at %.

4. The method of claim 1 further comprising forming a non-carbon-containing epitaxial layer between the first silicon layer and the substrate.

5. The method of claim 1 wherein the desired thickness is between about 10 Å and 2000 Å.

6. The method of claim 1 wherein the initial carbon concentration is greater than or equal to the target carbon concentration.

7. The method of claim 1 wherein etching the epitaxial layer stack includes etching the epitaxial layer stack in an etchant gas that includes $Cl_2$.

8. The method of claim 1 wherein each second silicon layer has a thickness that prevents a reaction from occurring between the etchant gas and the first silicon layers.

9. The method of claim 1 wherein forming at least one of the first silicon layers and the second silicon layers is performed at a temperature less than or about 700° C.

10. A method of controlling carbon concentration in an epitaxial layer stack formed on a substrate comprising:
    determining a desired target carbon concentration for the epitaxial layer stack; and
    forming the epitaxial layer stack by:
    (a) forming a first epitaxial layer on the substrate, the first epitaxial layer comprising carbon;
    (b) forming a non-carbon-containing cap layer on the first epitaxial layer;
    (c) causing carbon from the first epitaxial layer to distribute to the cap layer;
    (d) etching to remove a portion of the cap layer;
    (e) repeating steps (a) through (d) until the etched epitaxial layer stack has a desired thickness; and
    (f) controlling one or more of: (i) an initial carbon concentration, (ii) a thickness and (iii) a deposition time of the first epitaxial layers to achieve the target carbon concentration of the etched epitaxial layer stack.

11. The method of claim 10 further comprising forming a seed epitaxial layer between the first epitaxial layer and the substrate.

12. The method of claim 10 wherein the target carbon concentration is between about 200 ppm and 5 at %.

13. The method of claim 10 wherein each first epitaxial layer has a thickness of between about 2 angstroms and 100 angstroms.

14. The method of claim 10 wherein etching comprises etching the epitaxial layer stack using $Cl_2$.

15. The method of claim 10 further comprising forming additional, alternating first epitaxial layers and cap layers for the epitaxial layer stack.

* * * * *